United States Patent
Hsu et al.

(10) Patent No.: US 6,396,324 B1
(45) Date of Patent: May 28, 2002

(54) CLOCK SYSTEM FOR AN EMBEDDED SEMICONDUCTOR MEMORY UNIT

(75) Inventors: Louis L. Hsu, Fishkill; Rajiv V. Joshi, Yorktown Heights, both of NY (US); Richard M. Parent, Shelburne, VT (US); Matthew R. Wordeman, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/566,311

(22) Filed: May 8, 2000

(51) Int. Cl.[7] .................................................. G06F 1/04
(52) U.S. Cl. ...................................... 327/298; 327/407
(58) Field of Search ................................ 327/403, 407, 327/544, 39–49, 291, 298–299

(56) References Cited

U.S. PATENT DOCUMENTS 5,416,434 A * 5/1995 Kootstra et al. ............. 327/113
5,798,961 A * 8/1998 Heyden et al. ............... 365/52
5,991,990 A * 8/1999 Hiiragizawa ................. 713/310

* cited by examiner

Primary Examiner—Toan Tran
Assistant Examiner—Cassandra Cox
(74) Attorney, Agent, or Firm—Dilworth & Barrese, LLP; Louis J. Percello

(57) ABSTRACT

A clock system is provided capable of using an external system clock for driving at least one charge circuit of a semiconductor memory unit for restoring and refreshing a data array of the memory unit. The clock system, in one embodiment, includes a plurality of control circuits each having a clock select circuit which has as an input the external system clock, an internal clock generator circuit for generating an internal system clock, and a multiplexer. The multiplexer has as inputs an output of the clock select circuit, i.e., the external system clock, and an output of the internal clock generator circuit, i.e., the internal system clock. The multiplexer outputs either the external system clock or the internal system clock to the at least one charge circuit according to at least one control signal transmitted by a central processing unit to the clock select circuit.

39 Claims, 4 Drawing Sheets

CLOCK SYSTEM FOR AN EMBEDDED SEMICONDUCTOR MEMORY UNIT

FIELD OF THE INVENTION

This invention relates to the field of integrated circuit (IC) design. Specifically, it discloses a clock system capable of using an external system clock for driving at least one voltage generator circuit of an embedded semiconductor memory unit. The clock system is designed to reduce power consumption while minimizing the amount of surface area required in implementing the memory unit, maximizing system performance and maintaining the integrity of the data stored within the embedded memory unit.

BACKGROUND OF THE INVENTION

Semiconductor memory units embedded within an integrated circuit (IC) system are arranged in arrays of cells, where each cell stores one bit of information (1 or 0). Generally, in order to maintain the integrity of the data stored within an embedded semiconductor memory unit, such as an embedded dynamic random access memory unit (eDRAM), each cell of the memory unit requires periodic refreshing, since a small amount of charge stored in each cell of the memory unit tends to leak off. Additionally, the charge must be restored when a particular cell is read. Accordingly, circuitry is required to manage or control such semiconductor memory units.

This circuitry may be an IC memory unit controller chip or other logic ICs external to the memory unit. When the circuitry, especially the refresh circuitry, is incorporated within the memory unit, the memory unit is called pseudo-static or quasi-static, such as a quasi-static RAM memory unit. A memory unit that has most of the controller functions incorporated within is referred to as integrated, such as an integrated RAM memory unit. For a large memory system using several memory units, the redundancy of having the controller circuitry on every memory unit would not be economical.

The power supplies for normal and refresh operations generally include several voltage generators, including charge pump circuits, to provide different voltage and current supplies to cells and other circuits of the memory unit. For example, three typical charge pump circuits for the eDRAM are the substrate bias circuit or Vbb charge circuit, the negative word-line-low bias circuit or Vwl charge circuit, and the boost word-line-high voltage or Vpp charge circuit. A respective constant-speed ring oscillator provided in proximity or within the memory unit is generally used to run each of these charge circuits. A typical frequency range for the oscillator is from 5 MHZ to 50 MHZ depending on the voltage or current required to be produced by the particular charge circuit.

For example, for the Vbb charge circuit, the required capacity is low, and therefore, a 5 MHZ oscillator is sufficient. On the other hand, for the Vwl charge circuit, which is designed to sink large amount of current during an active mode, a 40 MHZ oscillator is required. However, during a standby or sleep mode, when there is no access to the word-lines, a lower capacity standby charge circuit supported by a lower-speed oscillator is needed for the Vwl charge circuit to save power. Therefore, two oscillator circuits with different capacities are needed for the Vwl charge circuit, i.e., one for each mode, thereby necessitating the use of additional surface area in implementing the memory unit.

Further, when the operating voltage, i.e, Vdd, of the memory unit starts to drop, e.g., when power output from a battery decreases, the charge produced by the charge circuits is affected. For example, if the peak current provided by the Vpp charge circuit is 4 mA when Vdd is 1.8V, when the Vdd drops from 1.8V to 1.5V and lower, the peak current provided by the Vpp charge circuit is much less than 4 mA. This results in performance degradation of the memory unit which could lead to data corruption or loss, since the cells of the memory unit would not be adequately restored or refreshed.

Additionally, prior art memory units are designed for the oscillator circuit(s) of the charge circuits to keep running, even when the memory unit is in a standby or sleep mode. This causes substrate noise due to the unnecessary current being injected into the substrate of the memory unit. Substrate noise could cause the circuitry within the memory unit to overheat and thereby, lead to data corruption or loss.

Accordingly, a need exists for a system for driving charge pump circuits of a memory unit, such as an eDRAM memory unit, which reduces power consumption, minimizes the surface area required in implementing the memory unit, maximizes system performance and maintains the integrity of the data stored within the memory unit.

SUMMARY

The present invention is essentially a clock system for an embedded semiconductor memory unit. The clock system is capable of using an external system clock for driving at least one charge pump circuit of the semiconductor memory unit for restoring and refreshing a data array of the memory unit. The clock system is designed to reduce power consumption while minimizing the chip surface area required in implementing the memory unit, maximizing system performance and maintaining the integrity of the data.

In one embodiment, the clock system includes a plurality of control circuits each having a clock select circuit which has as an input the external system clock, an internal clock generator circuit for generating an internal system clock, and a multiplexer. The multiplexer has as inputs an output of the clock select circuit, i.e., the external system clock, and an output of the internal clock generator circuit, i.e., the internal system clock. The multiplexer outputs either the external system clock or the internal system clock to the at least one charge pump circuit according to at least one control signal transmitted by a central processing unit to the clock select circuit.

The control signal to the clock select circuit can, for example, be a sleep signal which causes a clock signal to the at least one charge pump circuit of the memory unit to be generated by the internal clock generator circuit. That is for the multiplexer to select the internal system clock for driving the at least one charge pump circuit. It is necessary to have both external and internal clock supplies, because during sleep mode, the external clock from the system may not be available. The control signal to the clock select circuit can also be an active mode signal which causes the clock signal to the at least one charge pump circuit of the memory unit to come from a system clock. That is for the multiplexer to select the external system clock for driving the at least one charge pump circuit. The control signal to the clock select circuit can also be a disable clock signal for disabling the clock select circuit. That is for the multiplexer to select the internal system clock for driving the at least one charge pump circuit.

In another embodiment, a clock system, in accordance with the principles of the invention, is designed to be incorporated within electronic devices powered by batteries.

The clock system prevents performance degradation of the memory unit which can lead to data corruption or loss when power output from a battery decreases, i.e., when the supply voltage decreases. The clock system selects the appropriate clock frequency for driving a charge pump circuit of the memory unit according to the supply voltage. When the supply voltage drops, a higher clock frequency is selected by the clock system for driving the charge pump circuit of the memory unit and thus, maintain the charge capacity of the charge circuit and the integrity of the data stored within the memory unit.

In a further embodiment, a clock system, in accordance with the principles of the invention, adjusts or controls the magnitude of the charge pump capacity of a charge pump circuit by changing the clock frequency routed to the charge pump circuit. This embodiment allows the clock system to drive the charge pump circuit between a high-power mode and a low-power mode depending on the clock frequency.

In yet another embodiment of the present invention, a clock is provided from the eDRAM unit during sleep mode to the memory controller or core so that the refresh clock and other clocks will be available to perform a low-power sleep operation.

DETAILED DESCRIPTION OF THE INVENTION

The present invention provides a clock system for an embedded semiconductor memory unit. The clock system is capable of using an external system clock for driving at least one charge pump circuit of the semiconductor memory unit. Preferably, a stand-alone clock system is provided within the memory unit. The memory unit can, for example, be an embedded dynamic random access memory unit (eDRAM) embedded within an integrated circuit system. The eDRAM includes a data array having cells requiring periodic restoring and refreshing to maintain the integrity of the data stored within the data array. It can also be an embedded Flash memory (eFLASH), which also requires one or more internal voltage generators. The Flash memory may need to modify the data, which is accomplished by erasing the array and reprogramming it. The charge pump circuit is capable of providing a charge capacity or maintaining a certain voltage level for normal read/write and for refreshing the cells of the data array within the memory unit. The clock system is also designed to reduce power consumption while minimizing the amount of surface area required in implementing the memory unit, maximizing system performance and maintaining the integrity of the data.

Figure 1A:
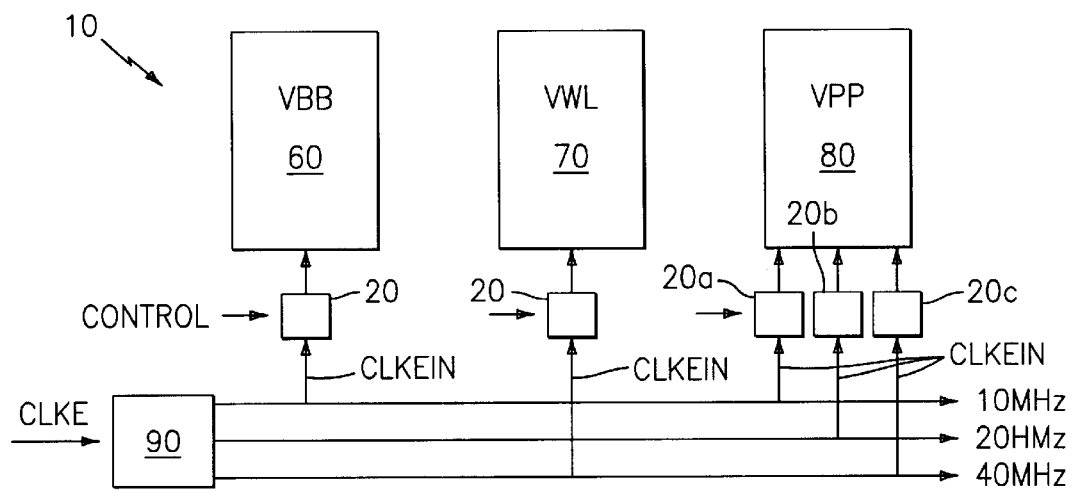
FIG. 1A is a block diagram of a clock system for driving at least one charge pump circuit of an embedded semiconductor memory unit according to the invention.
Figure 1B:
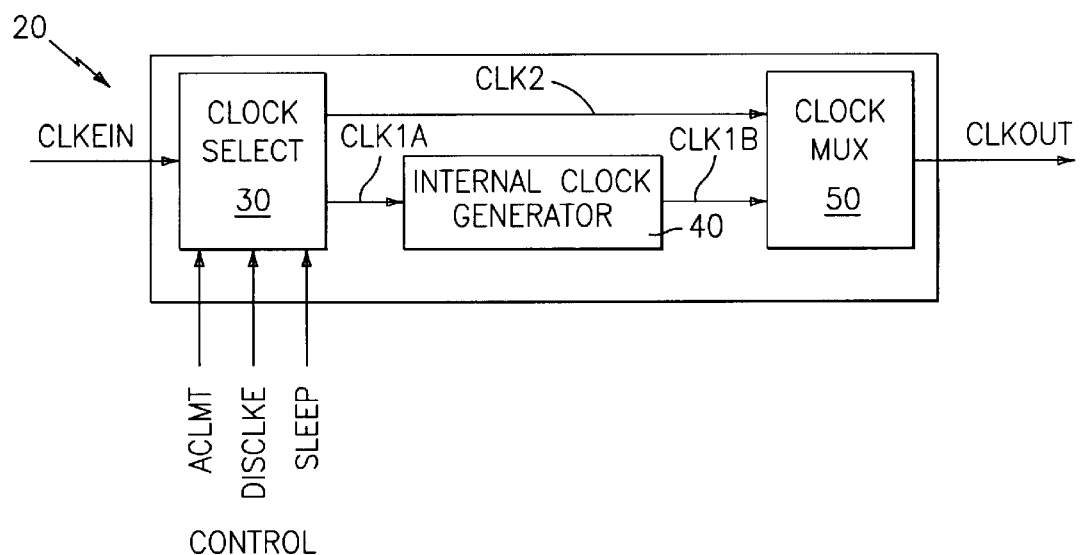
FIG. 1B is an enlarged view of a control circuit block shown in FIG. 1A.

With reference to FIGS. 1A and 1B, there is shown an embodiment of the clock system according to the principles of the invention and designated generally by reference numeral 10. The clock system 10 includes a plurality of control circuits 20 for receiving a CLKEIN signal and producing a CLKOUT signal for driving a respective charge pump circuit. Each of the plurality of control circuits 20 has a clock select circuit 30 (FIG. 2A) which has as an input from the external system clock, an internal clock generator circuit 40, as is known in the art, for generating an internal system clock, and a multiplexer 50 (FIG. 2B). The internal clock generator circuit 40 is optional. That is, the internal clock 40 is needed only when the external clock is not available. If the external clock (CLKE) supply's presence is guaranteed, then the internal clock generator circuit 40 and the associated clock select circuit 30 and clock multiplexer 50 may all be eliminated to conserve chip area.

The multiplexer 50 selects either output of the clock select circuit 30, i.e., the external system clock, or output of the internal clock generator circuit 40, i.e., the internal stand-alone clock. In other words, the multiplexer 50 multiplexes between the external system clock and the internal clock according to at least one control signal (CONTROL) transmitted by a central processing unit (not shown) and inputted to the clock select circuit 30. The central processing unit includes a series of programmable instructions for determining which control signal to transmit to the clock select circuit 30 based on the operating mode of the external system, e.g., active or sleep mode, and other conditions, such as a low power output from a battery.

The control signal to the clock select circuit 30 can, for example, be a sleep signal (SLEEP) which causes the CLKOUT signal to be the clock signal generated by the internal clock generator circuit 40. That is for the multiplexer 50 to select the internal system clock as the CLKOUT signal for driving the respective charge pump circuit. The control signal to the clock select circuit 30 can also be an active mode signal (ACLMT) which causes the CLKOUT signal to be a system clock. That is for the multiplexer 50 to select the external system clock as the CLKOUT signal for driving the at least one charge pump circuit. The control signal to the clock select circuit 30 can also be a disable clock signal (DISCLKE) for disabling the clock select circuit 30. That is for the multiplexer 50 to select the internal system clock as the CLKOUT signal for driving the at least one charge pump circuit.

The clock system 10 as shown by FIG. 1A includes three charge circuits (e.g., charge pump circuits), 60, 70, 80, i.e., the substrate bias circuit or Vbb charge circuit 60, the negative word-line-low bias circuit or Vwl charge circuit 70, and the boost word-line-high or Vpp charge circuit 80. Each of the charge circuits typically include (not shown) a charge pump, a voltage limiter, and some driver circuits. A respective constant-speed ring oscillator provided in each of the control circuits 20 is generally used to run each of these charge circuits 60, 70, 80. First, the limiter detects the output voltage level and compares it to a target voltage. If the output voltage level is lower than the target, the oscillator will be enabled to run the charge circuit to pump charges from a lower voltage level, i.e. Vdd (or ground) to a higher voltage level, i.e. Vpp ( or Vbb). A typical frequency range for the oscillator is from 5 MHZ to 50 MHZ depending on the voltage or current required to be produced by the particular charge circuit.

The clock system 10 further includes a frequency divider 90, as is known in the art, for receiving the external system clock (CLKE) and dividing the external system clock into a plurality of clock frequencies, e.g., 10 MHZ, 20 MHZ and 40 MHZ, which denote the clock signal (CLKEIN) routed to the control circuits 20. Each clock frequency is routed to at least one of the control circuits 20 corresponding to a particular charge circuit. For example, the 10 MHZ clock frequency is routed to the Vbb charge circuit 60, since the oscillator of this charge circuit only requires a clock frequency of 10 MHZ to produce the required voltage or current. The 40 MHZ clock frequency is routed to the Vwl and Vpp charge circuits 70 and 80, since the oscillators of these charge circuits both require a clock frequency of 40 MHZ to produce the required voltage or current.

All of the clock frequencies are, however, capable of being routed to one of three control circuits 20 corresponding to the Vpp charge circuit 80, since this charge circuit has three oscillators. The three oscillators require a clock frequency of 10, 20 and 40 MHZ, respectively, for being driven. When a higher voltage or current is required to be produced by the Vpp charge circuit 80, the 40 MHZ clock frequency is routed to the Vpp charge circuit 80 via the third control circuit 20c. This frequency will be used to run the charge pump during active mode. When a medium voltage or current is required to be produced by the Vpp charge circuit 80, the 20 MHZ clock frequency is routed to the Vpp charge circuit 80 via the second control circuit 20b. This frequency will be used to run the charge pump during power-on mode. When a low voltage or current is required to be produced by the Vpp charge circuit 80, the 10 MHZ clock frequency is routed to the Vpp charge circuit 80 via the first control circuit 20a. In the sleep mode, the slow clock frequency is designed to run the charge pump at low-power mode. It is contemplated that each charge circuit have a respective frequency divider 90 for receiving the external system clock, so that the generated external system clocks do not have to travel a distance before reaching their corresponding charge circuit.

Figure 2A:
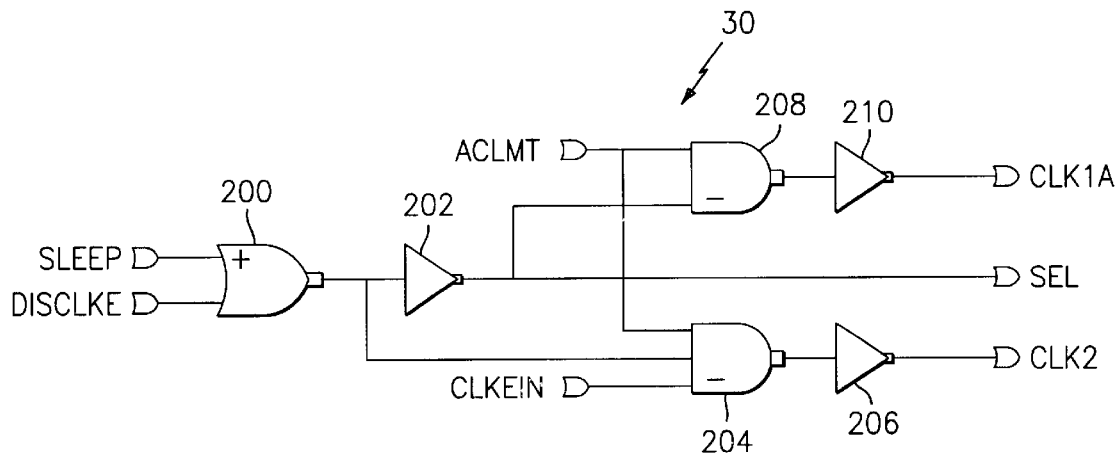
FIG. 2A is a schematic diagram of a clock select circuit shown in FIG. 1A.
Figure 2B:
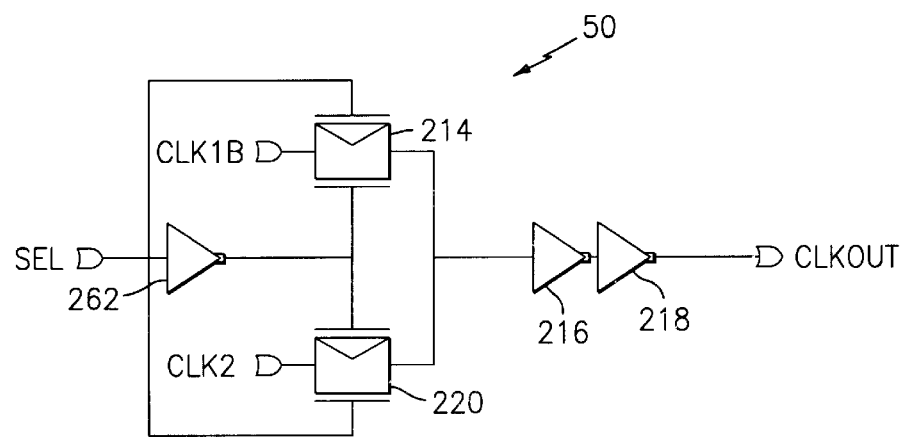
FIG. 2B is a schematic diagram of a multiplexer shown in FIG. 1A.

With reference to FIG. 2A, there is shown a schematic diagram of a preferred design of the clock select circuit 30. The function of the clock select circuit 30 is to select between the internal or external system clocks via signals CLK1A, CLK2, respectively. If the internal system clock is selected, a high signal is transmitted to the internal clock generator 40 to drive the internal clock generator circuit 40. If the external system clock is selected, a logic low signal is transmitted to the internal clock generator circuit 40 to disable the internal clock generator circuit 40 and save power, as further described below.

The central processing unit or other processor, upon executing a series of programmable instructions stored therein, transmits control signals, such as the SLEEP, DISCLKE and ACLMT control signals, to the clock select circuit 30. These signals permit the clock select circuit 30 to select the internal system clock during sleep mode and to select the external system clock during active mode.

In the preferred design of the clock select circuit 30, as shown by FIG. 2A, during the sleep mode, a high SLEEP signal and a high DISCLKE signal are transmitted to NOR gate 200 which causes the output of NOR gate 200 to be low.

This causes the output of inverter gate 202 to be high, thereby outputting a high select signal (SEL). The SEL signal can be inputted to the clock divider 90 to disable and reset the clock divider 90 during the sleep mode to save power. Alternatively, circuit 90 may be a frequency multiplier. In such a case, a clock with a higher frequency than that of the external clock is generated and used. The CLKEIN signal is low and the ACLMT signal is high during the sleep mode. The CLKEIN, ACLMT and the low output of NOR gate 200 are inputted to NAND gate 204, which causes the output of NAND gate 204 to be high. Accordingly, the output of inverter gate 206 is low and the CLK2 signal is low and the external system clock is not selected or outputted by the clock select circuit 30.

Meanwhile, the inputs to NAND gate 208 are both high which causes the output of NAND gate 208 to be low. This causes the output of inverter gate 210 to be high. This high output signal, CLK1A, is transmitted to the internal clock generator circuit 40 which drives the internal clock generator 40 to generate a CLK1B signal. The CLK1B signal is then transmitted to the multiplexer 50. Therefore, during the sleep mode, the clock divider 90 is disabled to save power and all the CLKOUT signals from the control circuits 20 to the charge circuits 60, 70, 80 are from the local ring oscillators of the internal clock generator circuit 40 in accordance with the principles of the invention.

It is contemplated that during the sleep mode, the external system clock is disabled to save power. The external system clock may be disabled electronically by transmitting a control signal from the clock select circuit 30 to the external system clock manually or by powering off the central processing unit.

With continued reference to the preferred design of the clock select circuit 30 shown by FIG. 2A, during the active mode, a low SLEEP signal and a low DISCLKE signal are transmitted to NOR gate 200 which causes the output of NOR gate 200 to be high. This causes the output of inverter gate 202 to be low, thereby outputting a low select signal (SEL). This prevents the clock divider 90 from being disabled during the active mode, if the SEL signal is used to control the clock divider 90. The CLKEIN signal is high and the ACLMT signal is also high during the active mode. The CLKEIN, ACLMT and the high output of NOR gate 200 are inputted to NAND gate 204, which causes the output of NAND gate 204 to be low. Accordingly, the output of inverter gate 206 is high and the CLK2 signal is high so that the external system clock is selected or outputted by the clock select circuit 30 during the active mode in accordance with the principles of the invention.

Meanwhile, one input to NAND gate 208 is low and one input (ACLMT) is high which causes the output of NAND gate 208 to be high. This causes the output of inverter gate 210 to be low. Hence, the clock select circuit 30 outputs a low signal CLK1A to the internal clock generator circuit 40, and hence, the internal clock generator circuit 40 is disabled to save power during the active mode.

The multiplexer 50 of the invention will now be described with reference to FIG. 2B. As discussed above, during the sleep mode, the internal stand-alone clock is selected by the clock select circuit 30. In other words, a high signal CLK1A is transmitted to the internal clock generator 40 of the control circuit 20 to enable the internal clock generator circuit 40 to output the internal system clock to the multiplexer 50. The signal generated by the internal system clock is designated as CLK1B in FIG. 2B. During the active mode, the external system clock is outputted by the clock select circuit 30 to the multiplexer 50. The external system clock is designated as IN2 in FIG. 2B. During the active mode, the external system clock is outputted by the clock select circuit 30 to the multiplexer 50. The signal generated by the external system clock and processed by the clock select circuit 30 is designated as CLK2 in FIG. 2B.

The SEL signal is also transmitted to the multiplexer 50 from the clock select circuit 30. The SEL signal enables the multiplexer 50 to select between CLK1B i.e., the internal stand-alone clock, or CLK2, i.e., the external system clock. When the internal stand-alone clock is desired, the SEL signal is high as indicated above in conjunction with FIG. 2A, the CLK1B signal is also high and the CLK2 signal is low. The high SEL signal is inverted by invertor gate 212 to a low signal. Hence, the high SEL signal will allow CLK1B (i.e., the internal clock) to pass through the lower transmission gate 220 to CLKOUT. A transmission gate is a switch which is formed by a pair of pMOS and nMOS transistors connected in parallel. On the other hand, low SEL signal will allow CLK2 (i.e., the external clock) to pass through the upper transmission gate 214 to CLKOUT.

Hence, in accordance with the present invention, when the external system clock is desired, the charge circuits 60, 70, 80 of the embedded memory unit can be activated by an external system clock. Whenever the external system clock is not available, internal stand-alone clocks are generated to activate the charge circuits 60, 70, 80, and when the external system clock is available, the internal clock generators 40 of the control circuits 20 are disabled. It has been shown that this configuration provides for considerable power savings as compared to prior art designs which only use clocks generated by local oscillators to perform read/write and refresh operations on the cells of the embedded memory.

Figure 3:
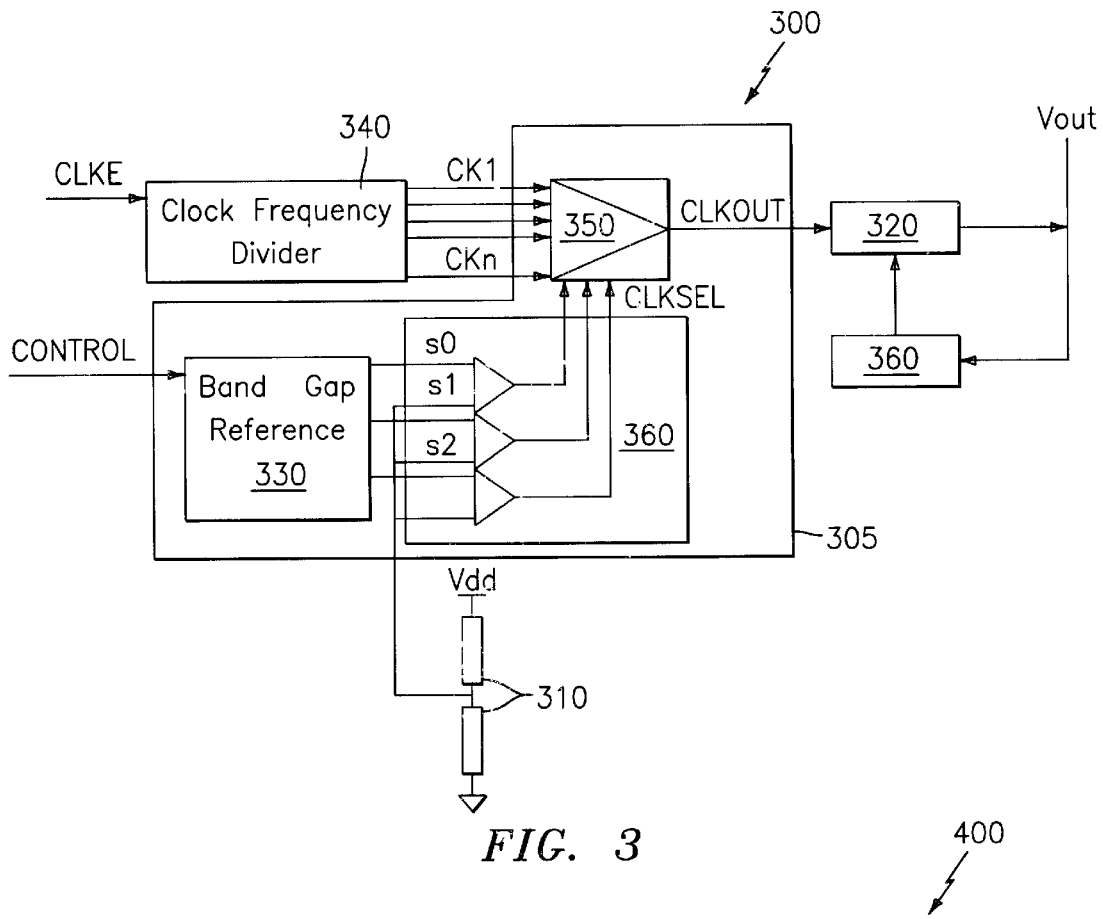
FIG. 3 is a block diagram of an alternate embodiment of the clock system.

In an alternate embodiment of the invention, as shown by FIG. 3, the clock system of the present invention, designated generally by reference numeral 300, is designed to be incorporated within a system powered by batteries. The system 300 is similar to the system 10 of FIGS. 1A and 1B with different control circuitry, designated by reference numeral 305, as opposed to control circuit 20, for activating a charge circuit of an embedded memory unit using an external system clock. The clock system 300 prevents performance degradation of the memory unit which can lead to data corruption or loss when power output from the batteries 310 decreases, i.e., when the supply voltage Vdd decreases. The clock system 300 selects the appropriate clock frequency for driving a charge circuit 320 of the memory unit according to the supply voltage Vdd. When the supply voltage Vdd drops, a higher clock frequency is selected by the clock system 300 for driving the charge circuit 320 of the memory unit and thus, maintain the charge capacity of the charge circuit 320 and the integrity of the data stored within the memory unit.

In particular with reference to FIG. 3, the clock system 300 includes a bandgap reference circuit 330 which creates several reference voltages s0, s1, s2, and a clock frequency divider 340 which receives an external system clock CLKE and generates a plurality of clocks CK1 . . . CLKn. The generated clocks CK1 . . . CLKn are inputted to a multiplexer 350. The bandgap reference circuit 330 is controlled by CONTROL signals transmitted by a central processing unit or some other processor. These CONTROL signals can be SLEEP, POWERON or DISABLE. For example, the SLEEP signal allows the bandgap reference circuit 330 to operate at low-power. The POWERON signal may be a kick-off signal to activate the bandgap reference circuit 330 during system power-on. The DISABLE signal will disable the bandgap circuit. The bandgap reference voltage from the bandgap reference circuit 330 is insensitive to the supply voltage Vdd and chip temperature.

The reference voltages s0, s1, s2 are generated from the bandgap reference circuit 330. They are then inputted to a comparator, 360 where they are compared to a respective set of monitored voltages s0', s1', s2', (not shown) which are from a voltage divider (not shown). The monitored voltages are proportional to the supply voltage Vdd supplied by the batteries 310. When the supply voltage Vdd drops, e.g., the batteries 310 become weak, the comparator 360 is able to determine the degree of degradation of the supply voltage Vdd. Accordingly, the comparator 360 activates only one of CLKSEL signals based on the results of the comparison, which in turn select one proper clock frequency from the clock frequency divider 340 via the multiplexer 350.

The selected clock frequency (higher than the original frequency) is then inputted to the charge circuit 320 as signal CLKOUT to drive the charge circuit 320, in order for the charge circuit 320 to maintain the appropriate charge capacity. A feedback signal from Vout to a voltage limiter 360 switches the charge circuit 320 from on to off when Vout has reached the target level, and vice versa.

It is contemplated that the clock system 300 may be duplicated in an electronic device powered by battery power. Hence, a plurality of charge circuits can be driven and have their charge capacity dynamically maintained, even when the supply voltage Vdd drops, to maintain a certain quality of performance of the electronic device. It is further contemplated to provide the clock system 300 in electronic devices which are not powered by batteries, but are susceptible to drops in their supply voltage Vdd.

Figure 4:
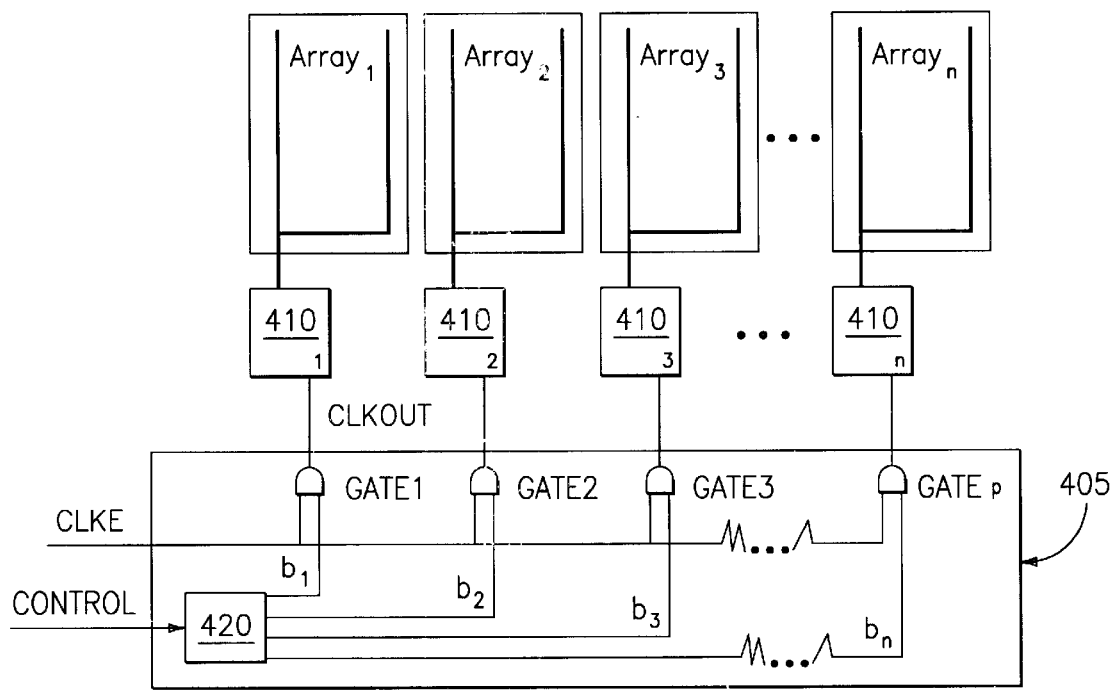
FIG. 4 is a block diagram of an alternate embodiment of the clock system.

The invention further provides a distributed voltage generator system, designated generally by reference numeral 400, capable of performing read/write operations and refreshing a plurality of memory arrays at different times using an external system clock CLKE as shown by FIG. 4. The system 400 is similar to the system 10 of FIGS. 1A and 1B with different control circuitry, designated by reference numeral 405, as opposed to control circuit 20, for activating a charge pump circuit of an embedded memory unit using an external system clock.

The system 400 is supplied with an external system clock CLKE. The CLKE clock signal is ANDed together with respective local control signals b1, b2, b3 . . . bn through AND logic gates GATE1, GATE2, GATE3, GATEn. Their outputs are used to control each of the generator circuits $410_{1-n}$. The generator circuits $410_{1-n}$ are in turn connected to the power supplies of memory arrays 1–n. The local control signals b1, b2, b3 . . . bn are generated from a select circuit 420 by control pin CONTROL. This control circuit can be a bank decoder which is normally used to select one or more memory blocks (or banks) for action.

In operation, when logic signal b1 outputted by the select circuit 420 is high, the external clock CLKE will pass the logic AND gate GATE1 and the corresponding charge circuit, i.e., charge circuit $410_1$, is turned on to supply charges to sustain operation in memory array. Meanwhile, outputs b2–bn of the select circuit 420 are preferably kept low to maintain charge circuits $410_{2-n}$ off to conserve power. The process is repeated sequentially or randomly during the array process. That is, for example, after charge circuit $410_1$ is restored and/or refreshed, logic signal b2 is made high to turn on charge circuit $410_2$ to refresh and/or restore data array 2, and so on, until all of the data arrays are restored and/or refreshed. Accordingly, the voltage generator system 400 of FIG. 4 reduces power consumption.

It is contemplated that logic circuitry is connected to select circuit 420 for providing control signals CONTROL to select circuit 420 to control which logic signals b1–bn are to be high and which logic signals b1–bn are to be low. It is also contemplated that the select circuit 420 be connected to a central processing unit or other processor executing a series of programmable instructions for providing control signals CONTROL for controlling the operation of the select circuit 420.

Figure 5:
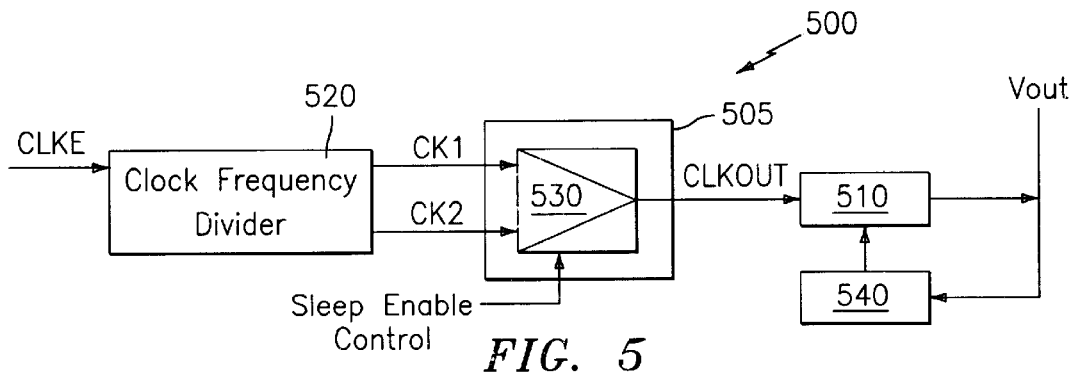
FIG. 5 is a block diagram of an alternate embodiment of the clock system.

In a further embodiment of the invention, as shown by FIG. 5, a clock system, designated generally by reference numeral 500, adjusts or controls the magnitude of the charge capacity of a charge circuit 510 by changing the clock frequency routed to the charge circuit 510. The system 500 is similar to the system 10 of FIGS. 1A and 1B with different control circuitry, designated by reference numeral 505, as opposed to control circuit 20, for activating a charge circuit of an embedded memory unit using an external system clock.

In operation, the clock system 500 enables the charge circuit 510 to be driven between a high-power mode and a low-power mode depending on the clock frequency. Clock signals CK1 and CK2 are two different, predetermined clock rates generated from the external system clock CLKE after it is fed to clock frequency divider 520. If CK1>CK2, then when a multiplexer 530 receives a high sleep enable signal from a central processing unit or other processor executing a series of programmable instructions, the multiplexer 530 selects clock signal CK2 as the CLKOUT signal for driving the charge circuit 510.

That is, the multiplexer 530 is logically designed to select clock signal CK2 when the system is operating in the sleep mode and CK1>CK2. The multiplexer 530 is similar in operation to the multiplexer 50 of FIG. 2B, the design of which is well known in the art. The charge circuit 510 produces the same voltage level, since the voltage of a voltage limiter 540 does not change. But, since during the sleep mode the charge circuit 510 is not expected to provide high current, the low frequency clock saves power, especially, standby power. When the system is operating in the active mode, a low sleep enable signal is transmitted to the multiplexer 530 and hence, clock signal CK1 is selected by the multiplexer 530 as the CLKOUT signal for driving the charge circuit 510. Accordingly, the charge circuit 510 resumes its preset charge capacity.

It is contemplated that other CONTROL signals besides the sleep enable signal can be transmitted to the multiplexer 530 by the central processing unit or other processor executing a series of programmable instructions to select between CK1 and CK2.

Figure 6A:
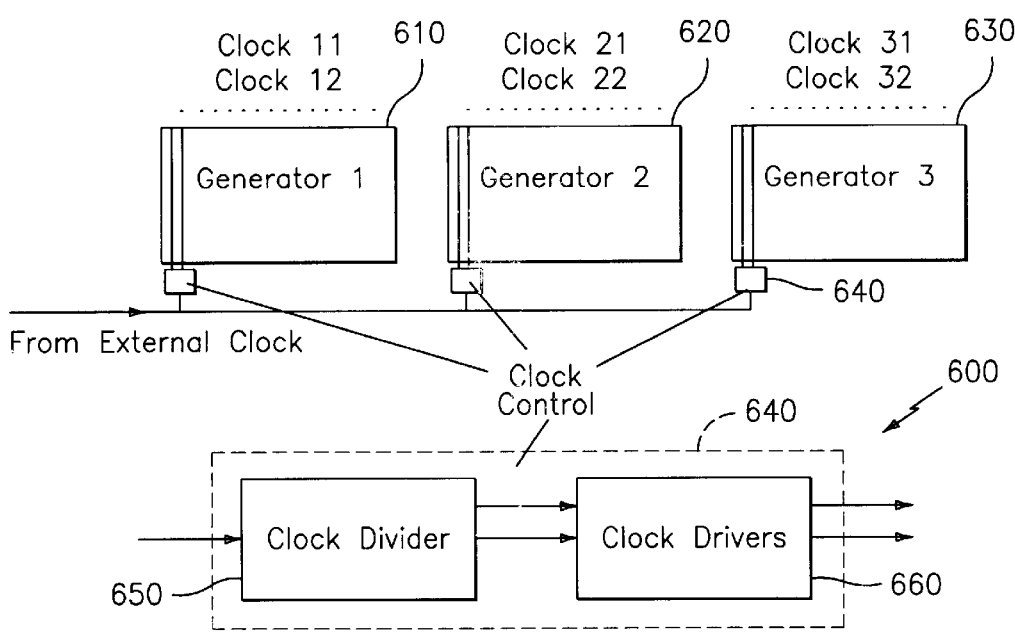
FIG. 6A is a block diagram of a system incorporating the clock system of the invention for driving at least one charge circuit.

With reference to FIG. 6A, there is shown a block diagram of a system incorporating the clock system of the invention for driving at least one charge circuit of an embedded memory unit using an external system clock, designated generally by reference numeral 600. The external system clock can be fed to the embedded memory unit and be routed to each of the generator circuits 610, 620, 630. At each of the generator circuits 610, 620, 630, a clock control block 640 including control circuitry, as shown in the dashed box, such as a clock divider 650 and clock drivers 660, is provided.

The clock control block 640 generates proper clocks depending on the need of each charge pump circuit. For example, for the Vpp charge circuit, clocks with 10, 20 and 40 MHZ are needed. For the Vwl charge circuit, a 40 MHZ clock is needed, and for the Vbb charge circuit, a 10 MHZ clock is needed.

Figure 6B:
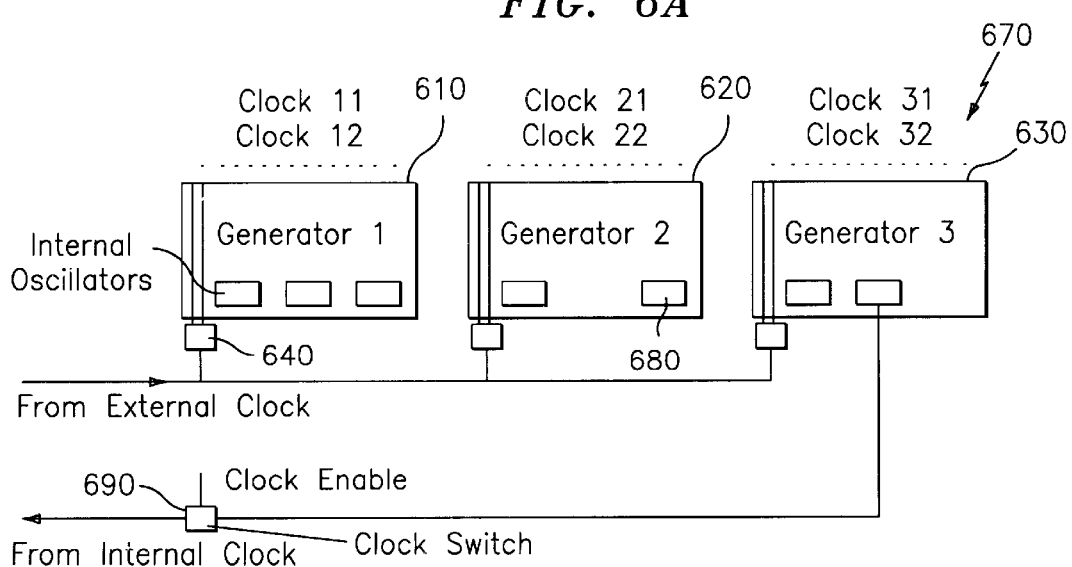
FIG. 6B is a block diagram of a system incorporating the clock system of the invention for driving at least one charge pump circuit and outputting at least one clock to an external system.

FIG. 6B shows a block diagram of a system incorporating the clock system of the invention for driving at least one charge pump circuit of an embedded memory unit and outputting at least one stand-alone internal clock to an external system, designated generally by reference numeral 670. The embedded memory unit can simultaneously output more than one clock, which is generated by its internal oscillators 680 upon being driven by the external system clock, to the external system, or non-simultaneously through the use of clock switch 690. The clock switch 690 is controlled by a clock enable signal transmitted by a central processing unit or other processor executing a series of programmable instructions. It is contemplated that the frequency of a clock outputted by the system 670 can be modified using a frequency multiplier or divider.

What has been described herein is merely illustrative of the application of the principles of the present invention. For example, the functions described above and implemented as the best mode for operating the present invention are for illustration purposes only. Other arrangements and methods may be implemented by those skilled in the art without departing from the scope and spirit of this invention.

What is claimed is:

1. A clock system for driving at least one charge circuit of a semiconductor memory unit, said clock system comprising:
   means for receiving at least one external system clock; and
   control circuitry having means for receiving and logically processing at least one control signal from a processor and at least one clock signal from said means for receiving said at least one external system clock, and means for selecting a respective one of a first clock signal of at least one first clock signal output by said means for receiving and logically processing at least one control signal, and a second clock signal of at least one second clock signal, and outputting at least one driving clock signal to said at least one charge circuit according to said at least one control signal.

2. The clock system according to claim 1, wherein said means for receiving said at least one external system clock is a frequency divider.

3. The clock system according to claim 1, wherein said means for receiving said at least one external system clock is a frequency multiplier.

4. The clock system according to claim 2, wherein said frequency divider is disabled when said at least one control signal includes a logic high sleep mode signal.

5. The clock system according to claim 1, wherein said at least one clock signal has a frequency different from the frequency of said at least one external system clock.

6. The clock system according to claim 1, wherein said semiconductor memory unit is a dynamic random access memory (DRAM) unit embedded within an integrated circuit system.

7. The clock system according to claim 1, wherein said semiconductor memory unit is a non-volatile Flash memory unit embedded within an integrated circuit system.

8. The clock system according to claim 1, wherein said at least one control signal received from said processor includes a logic high sleep mode signal when said memory unit is operating in a sleep mode.

9. The clock system according to claim 1, wherein said at least one control signal received from said processor includes a logic high active mode signal when said memory unit is operating in an active mode.

10. The clock system according to claim 1, wherein said at least one control signal received from said processor includes a logic high active mode signal when said memory unit is operating in an active low-power mode when Vdd is lower than the predetermined level.

11. The clock system according to claim 1, wherein said control circuitry further includes an internal clock generator having means for generating said second clock signal.

12. The clock system according to claim 11, wherein said internal clock generator is enabled when said at least one control signal includes a logic high sleep mode signal and disabled when said at least one control signal includes a logic high active mode signal.

13. The clock system according to claim 12 wherein said means for selecting and outputting outputs said second clock signal to said at least one charge circuit when said at least one control signal includes said logic high sleep mode signal.

14. The clock system according to claim 12, wherein said means for selecting and outputting outputs said at least one clock to said at least one charge circuit when said at least one control signal includes said logic high active mode signal.

15. The clock system according to claim 1, wherein said means for selecting further includes a multiplexer for receiving said at least one clock signal and said second clock signal generated by an internal clock generator for outputting either said at least one clock signal or said second clock signal according to said at least one control signal.

16. The clock system according to claim 1, wherein said means for receiving and logically processing includes means for transmitting a disable signal to said means for receiving said at least one external system clock when said at least one control signal includes a logic high sleep mode signal.

17. The clock system according to claim 1, wherein said means for receiving and logically processing further includes means for generating at least one logic signal and at least one AND gate having means for receiving said at least one clock signal, and said means for selecting further includes means for receiving said at least one logic signal and generating at least one output.

18. The clock system according to claim 17, wherein said at least one output is a logic high signal for driving said at least one charge circuit, if said at least one clock signal is a logic high signal and said at least one logic signal is a logic high signal.

19. The clock system according to claim 18, wherein said at least one output is a logic low signal for disabling said at least one charge circuit, if said at least one clock signal is a logic high signal and said at least one logic signal is a logic low signal.

20. The clock system according to claim 1, wherein said means for selecting and outputting is at least one multiplexer, wherein each output driving signal of said at least one output driving signal is the respective selection.

21. The clock system according to claim 20, wherein said at least one multiplexer is controlled by at least one control signal outputted by a comparator circuit, said comparator circuit having means for receiving a plurality of reference voltages and a plurality of monitored voltages which are proportional to a supply voltage supplied to said control circuitry, said comparator circuit comparing said plurality of reference voltages and said monitored voltages and outputting said at least one control signal to said at least one multiplexer for outputting one of a plurality of clocks according to said at least one control signal received from said comparator circuit.

22. The clock system according to claim 21, wherein said plurality of reference voltages are generated by a bandgap reference circuit.

23. The clock system according to claim 21, wherein said plurality of monitored voltages are generated by a voltage divider circuit.

24. The clock system according to claim 1, further comprising a voltage limiter connected to a supply voltage and said at least one charge circuit for providing a feedback signal to said at least one charge circuit for controlling the operation of said at least one charge circuit.

25. The clock system according to claim 20, wherein one of a plurality of clocks is transmitted by said at least one multiplexer to drive said at least one charge circuit at a low power level if said at least one control signal includes a logic high sleep mode signal, and at a high power level if said at least one control signal includes a logic high active mode signal.

26. The clock system according to claim 11, wherein said second clock signal is outputted to an external system.

27. The clock system according to claim 26, wherein said second clock signal is controlled by a clock switch, said clock switch being controlled by at least one clock switch control signal.

28. The clock system according to claim 1, wherein generation of the second clock signal is controlled by a control output of said means for receiving and logically processing.

29. The clock system according to claim 1, wherein the driving clock signal to said at least one charge circuit is output according to said at least one processed control signal.

30. A clock circuit for driving at least one charge circuit of a semiconductor memory unit, said clock circuit comprising:
   a clock control circuit for receiving at least one clock signal from a frequency divider and at least one control signal from a processor, said at least one clock signal being derived from at least one external system clock received by said frequency divider; an internal clock generator connected to a first output of said clock control circuit; and
   a multiplexer connected to a second output of said clock control circuit and an output of said internal clock generator, said multiplexer outputting at least one driving signal to said at least one charge circuit for operating said at least one charge circuit between low power and high power.

31. The clock circuit according to claim 30, wherein said clock control circuit outputs a signal to said internal clock generator via said first output for driving said internal clock generator for generating at least one internal system clock when said at least one control signal includes a logic high sleep mode signal.

32. The clock circuit according to claim 31, wherein said internal clock generator outputs said at least one internal system clock via said output of said internal clock generator to said multiplexer, said multiplexer receiving said at least one internal system clock and outputting said at least one driving signal to said at least one charge circuit for operating said at least one charge circuit at low power.

33. The clock circuit according to claim 30, wherein said clock control circuit outputs said at least one clock signal to said multiplexer via said second output when said at least one control signal includes a logic low sleep mode signal, said multiplexer receiving said at least one clock signal and outputting said at least one driving signal to said at least one charge circuit for operating said at least one charge circuit at high power.

34. The clock circuit according to claim 30, wherein said frequency divider is disabled when said at least one control signal includes a logic high sleep mode signal.

35. The clock circuit according to claim 30, wherein said semiconductor memory unit is a dynamic random access memory (DRAM) unit embedded within an integrated circuit system.

36. The clock circuit according to claim 30, wherein said at least one internal system clock is outputted to an external system.

37. A clock circuit for driving at least one charge circuit of a semiconductor memory unit, said clock system comprising:

a clock control circuit for receiving first and second clock signals from a frequency divider and at least one control signal from a processor, said first and second clock signals being derived from at least one external system clock received by said frequency divider, said first clock signal having a higher clock frequency than said second clock signal, wherein said clock control circuit outputs said first clock signal to drive said at least one charge circuit when said at least one control signal includes a logic low sleep mode signal, and wherein said clock control circuit outputs said second clock signal to drive said at least one charge circuit when said at least one control signal includes a logic high sleep mode signal.

38. The clock circuit according to claim 37, further comprising a voltage limiter connected to said supply voltage and said at least one charge circuit for providing a feedback signal to said at least one charge circuit for controlling the operation of said at least one charge circuit.

39. The clock circuit according to claim 37, wherein said semiconductor memory unit is a dynamic random access memory (DRAM) unit embedded within an integrated circuit system.

* * * * *